(12) United States Patent
Kuehlwein et al.

(10) Patent No.: US 11,238,006 B2
(45) Date of Patent: *Feb. 1, 2022

(54) METHODS AND APPARATUSES FOR DIFFERENTIAL SIGNAL TERMINATION

(71) Applicant: MICRON TECHNOLOGY, INC., Boise, ID (US)

(72) Inventors: Jeremy Kuehlwein, Woodbury, MN (US); Gregory King, Hastings, MN (US); Michael Stay, Minneapolis, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/412,254

(22) Filed: May 14, 2019

(65) Prior Publication Data

US 2019/0266121 A1    Aug. 29, 2019

Related U.S. Application Data

(63) Continuation of application No. 15/418,586, filed on Jan. 27, 2017, now Pat. No. 10,366,041.

(51) Int. Cl.
*G06F 13/42* (2006.01)
*H01L 25/18* (2006.01)
(Continued)

(52) U.S. Cl.
CPC ...... *G06F 13/4286* (2013.01); *G06F 13/4022* (2013.01); *H01L 23/481* (2013.01); *H01L 25/0657* (2013.01); *H01L 25/18* (2013.01); *H03F 1/26* (2013.01); *H03F 3/245* (2013.01); *H03F 3/45475* (2013.01); *H01L 2225/06513* (2013.01); *H01L 2225/06517* (2013.01); (Continued)

(58) Field of Classification Search
CPC ............. G06F 13/4286; G06F 13/4022; H01L 12/481; H01L 2225/06513; H01L 2225/06517; H01L 2225/06541; H03F 2203/45051; H03F 2203/45151; H03F 2203/45534
USPC ....................................................... 710/106
See application file for complete search history.

(56) References Cited

U.S. PATENT DOCUMENTS 6,055,191 A * 4/2000 Sher .................. G11C 7/1051
326/26
6,324,088 B1 * 11/2001 Keeth .................. G11C 5/025
365/51
(Continued)

*Primary Examiner* — Henry Tsai
*Assistant Examiner* — Aurangzeb Hassan
(74) *Attorney, Agent, or Firm* — Dorsey & Whitney LLP

(57) ABSTRACT

According to one embodiment, an apparatus comprises a differential signaling bus, a tristate transmitter connected with the differential signaling bus, the tristate transmitter configured to provide a signal on the differential signaling bus responsive to a corresponding control signal, a receiver, a pair of differential inputs of the receiver connected with the differential signaling bus and configured to receive the signal from the differential signaling bus, and a termination circuit configured to couple a first differential input of the pair of differential inputs to a first voltage source and to couple a second differential input of the pair of differential inputs to a second voltage source, wherein the first and second voltage sources have different voltage levels.

23 Claims, 8 Drawing Sheets

(51) Int. Cl.

|  |  |
|---|---|
| *H01L 25/065* | (2006.01) |
| *G06F 13/40* | (2006.01) |
| *H03F 1/26* | (2006.01) |
| *H03F 3/24* | (2006.01) |
| *H03F 3/45* | (2006.01) |
| *H01L 23/48* | (2006.01) |

(52) U.S. Cl.
CPC ............ *H01L 2225/06541* (2013.01); *H03F 2203/45051* (2013.01); *H03F 2203/45151* (2013.01); *H03F 2203/45534* (2013.01)

(56) References Cited

U.S. PATENT DOCUMENTS

| | | |
|---|---|---|
| 8,390,315 B1 | 3/2013 | Wang et al. |
| 8,933,729 B1 | 1/2015 | Shi et al. |
| 9,407,469 B2 | 8/2016 | Agrawal et al. |
| 10,366,041 B2 | 7/2019 | Kuehiwein et al. |
| 2006/0129733 A1* | 6/2006 | Sobelman ........... H04L 25/0262 710/305 |
| 2007/0069808 A1* | 3/2007 | Do ......................... G05F 1/465 327/541 |
| 2011/0043286 A1 | 2/2011 | Youngblood |
| 2011/0292708 A1 | 12/2011 | Kang et al. |
| 2014/0133219 A1* | 5/2014 | Wu ....................... G11C 11/419 365/156 |
| 2014/0368272 A1 | 12/2014 | Wang et al. |
| 2018/0217960 A1 | 8/2018 | Kuehlwein et al. |
| 2019/0266121 A1 | 8/2019 | Kuehiwein et al. |
| 2020/0118609 A1* | 4/2020 | Brox ................... G11C 7/1084 |

\* cited by examiner

METHODS AND APPARATUSES FOR DIFFERENTIAL SIGNAL TERMINATION

CROSS-REFERENCE TO RELATED APPLICATION(S)

This application is a continuation of U.S. patent application Ser. No. 15/418,586 filed Jan. 27, 2017, and issued as U.S. Pat. No. 10,366,041 on Jul. 30, 2019. The aforementioned application, and issued patent, is incorporated herein by reference, in its entirety, for any purpose.

BACKGROUND

Differential transmitters communicate information by providing complementary signals from the transmitter to the receiver. Differential signaling may reduce the effects of electromagnetic noise on signal integrity by detecting the difference between the signals. Some differential transmitters (e.g., tristate transmitters) may also enter a high impedance state, where no signal is transmitted. Many traditional differential signaling circuits include termination circuits, such as termination resistances, coupling the complementary signal lines to ground. In such circuits, when the differential transmitter enters the high impedance state, any residual charge on the signal lines discharges to ground (or some other non-ideal leakage voltage). That is, during the high impedance state, the differential signal on the signal lines is lost as both signals discharge to the termination voltage (e.g., ground).

Differential signaling is common in many memory systems. For example, differential signaling may be used to provide data strobe signals to a data output buffer. A memory die may, for example, provide read data to an output buffer on a logic die and a differential strobe signal to a differential receiver on the logic die. The differential receiver may then provide an output strobe signal based on the received differential strobe signal. Often, several memory die, each one having its own differential transmitter, are stacked and coupled to a single differential receiver located on the logic die. When the transmitter of a particular memory die is not in use, it enters a high impedance state, effectively removing it from the circuit.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Embodiments disclosed herein recognize that traditional tristate transmitters, which pull both differential signal lines to ground when in a high impedance state, suffer from several drawbacks. For example, when the differential transmitter is in the high impedance state and the signal lines have discharged to ground (or other nonideal common voltage) through termination resistances, the output of the receiver may be at an unpredictable, intermediate level (since there is no longer a differential signal on which to base the output). As a result, when the transmitter exits the high impedance state and begins transmitting a differential signal, the differential receiver may not detect the first transition and thus it may not provide an output signal at the proper time. In systems where the differential receiver is used to provide data strobe signals, this may cause the first bit of output data to be missed. Additionally, if one of the differential signal lines has noise, then the output of the differential receiver may toggle between states, which may cause the differential receiver output to toggle between states. Such toggling may have adverse effects on data output. Embodiments of the present invention remedy the shortcomings of traditional differential signaling circuits by implementing termination circuits to maintain the differential nature of the signal lines when the transmitter enters the high impedance state. By doing so, the output of the receiver remains constant and predictable during the high impedance state.

Figure 1:
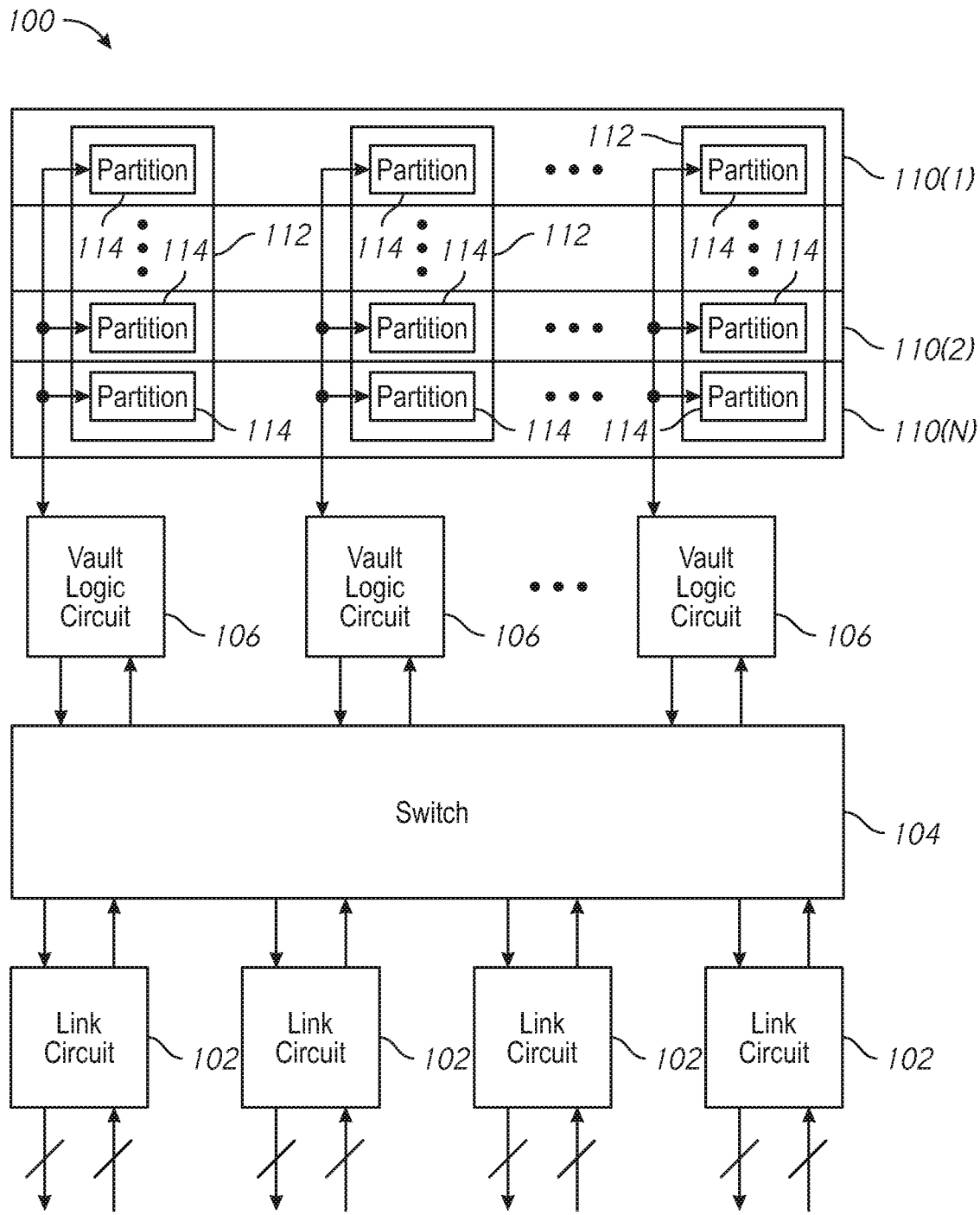
FIG. 1 is a block diagram of a memory system, in accordance with an embodiment of the present invention.

FIG. 1 is a block diagram of memory system, generally designated 100, in accordance with an embodiment of the present invention. The memory system 100 includes a plurality of links 102, a switch 104, a plurality of vault logic circuits 106, and a plurality of stacked memory dice 110 (1)-(N) (generally referred to as memory dice 110).

Each memory die 110 may include a plurality of memory cells, as well as circuitry for performing memory operations (e.g., reading from or writing to the memory cells). Embodiments of the present invention are not limited to a particular type of memory cell. For example the plurality of memory cells may include volatile memory, such as dynamic random access memory (DRAM), non-volatile memory, such as FLASH memory, or a combination of volatile and non-volatile memory cells. The memory cells of each memory die 110 may be grouped into one or more partitions 114. As shown in FIG. 1, each memory die 110 of the stacked memory dice 110(1)-(N) may include a plurality of partitions 114. The partitions 114 may also be grouped into a plurality of vaults 112, where each vault 112 includes partitions 114 from two or more memory dice 110. For example, a vault 112 may include one partition 114 from a memory die 110(1), one partition 114 from a memory die 110(2), etc. The arrangement and components of the memory dice 110(1)-(N) are discussed in further detail with respect to FIGS. 2-3.

The vault logic circuits 106 include circuit components configured to control memory operations for a particular vault 114. For example, the partitions 114 of a vault 112 may be accessed (e.g., written to, read from), based on commands received from a vault logic circuit 106. Each vault logic circuit 106 may include, for example, receiver circuits (e.g., a data receiver circuit and/or a strobe receiver circuit) (see FIG. 3) configured to receive read data and read strobe signals. Each vault logic circuit 106 may further include control circuitry (not shown) (see FIG. 3) configured control timing and synchronization of the read data signals and the read strobe signals. In various embodiments, the vault logic circuit 106 receives read data from a partition 114 of a vault 112, and provides the read data in accordance with a read strobe signal provided by the memory die 110 that includes the particular partition 112 from which the data was received. In various embodiments, the read strobe signal is provided by a differential transmitter included on the memory die 110 from which the data is being read. The read strobe signal is received by a differential receiver (not shown) (see FIG. 3) in the vault logic circuit 106.

The switch 104 may route data between the vault logic circuits 106 and a plurality of link circuits 102. The vault logic circuit 106 may provide the read data to the switch 104 based on the read strobe signal received from the memory die 110. The link circuits 102 may route data between the switch 104 and one or more host systems (not shown), such as processors. The link circuits 102 may include, for example a data serializer/deserializer to convert data from parallel to serial or vice versa as needed by the destination circuit (e.g., the switch 104 or the host system).

In an example operation, a processor provides a memory command, such as a read command to the link circuit 102, which provides the command to the switch 104. The switch 104 provides the command to the appropriate vault logic circuit 106. The vault logic circuit 106 may decode the command and provide the command to the vault 112 associated with the vault logic circuit 106. The command may indicate a particular partition 114 and address to read data from, which is then provided back to vault logic circuit 106. The vault logic circuit 106 then returns the read data back through the switch 104 and the link circuit 102 to the requesting processor.

Figure 2:
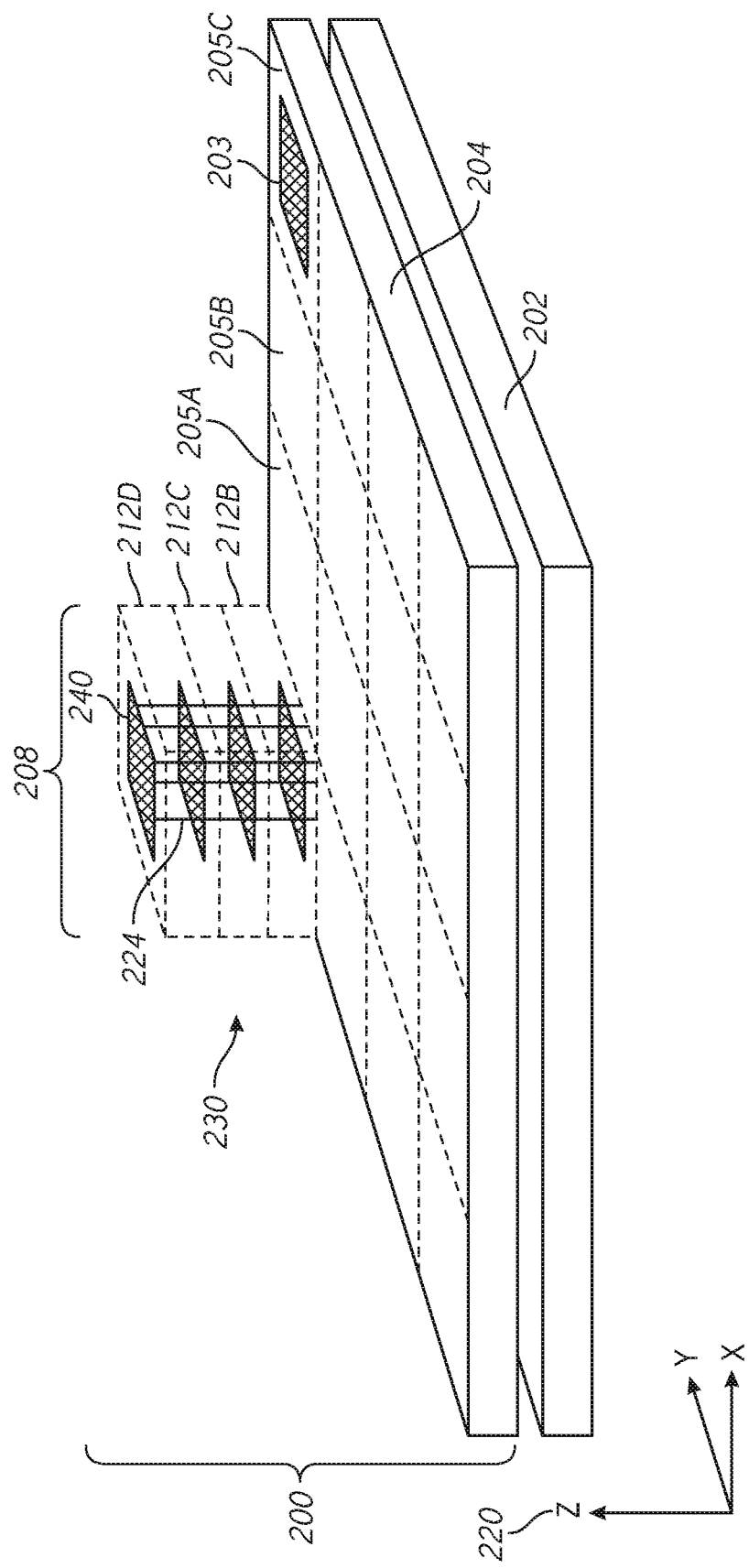
FIG. 2 is a cut-away perspective view of a stacked-die 3D memory array stacked with a logic die, in accordance with an embodiment of the present invention.

FIG. 2 is a cut-away perspective view of a stacked-die 3D memory array 200 stacked with a logic die 202, in accordance with an embodiment of the present invention. The memory system 100 incorporates one or more stacks of tiled memory arrays such as the stacked-die 3D memory array 200. Multiple memory arrays (e.g., the memory array 203) are fabricated onto each of a plurality of stacked dice (e.g., the stacked die 204).

Each of the stacked dice is logically divided into multiple partitions (e.g., the partitions 205A, 205B, and 205C associated with the stacked die 204). Each partition (e.g., the partition 205C) may include one or more memory arrays 203. In some embodiments, each memory array 203 may be configured as one or more independent memory banks in the memory system 100.

A stacked set of memory array partitions 208 may include a single partition from each of the stacked dice (e.g., the partitions 212B, 212C and 212D, with the base partition hidden from view in FIG. 2). Power, address, and/or data and similar common signals may traverse the stacked set of partitions 208 in the "Z" dimension 220 on conductive paths (e.g., the conductive path 224) referred to herein as "through-wafer interconnects" (TWIs) or "through silicon vias" (TSVs), which may form a differential signaling bus.

The stacked-die 3D memory array 200 is thus partitioned into a set of memory vaults (e.g., the memory vault 230). Each memory vault includes a stacked set of partitions, one partition from each of a plurality of stacked dice. Each partition of the vault includes one or more memory arrays (e.g., the memory array 240).

The resulting set of memory vaults 112 is shown in FIG. 1. Control, switching, and communication logic described here below is fabricated onto the logic die 202. The memory system 100 includes a plurality of vault logic circuits 106, Each vault logic circuit 106 is communicatively coupled to a corresponding memory vault (e.g., the memory vaults 112) in a one-to-one relationship. Each vault logic circuit 106 is thus capable of communicating with a corresponding memory vault independently from communications between other vault logic circuits 106 and their respective memory vaults 112.

Figure 3:
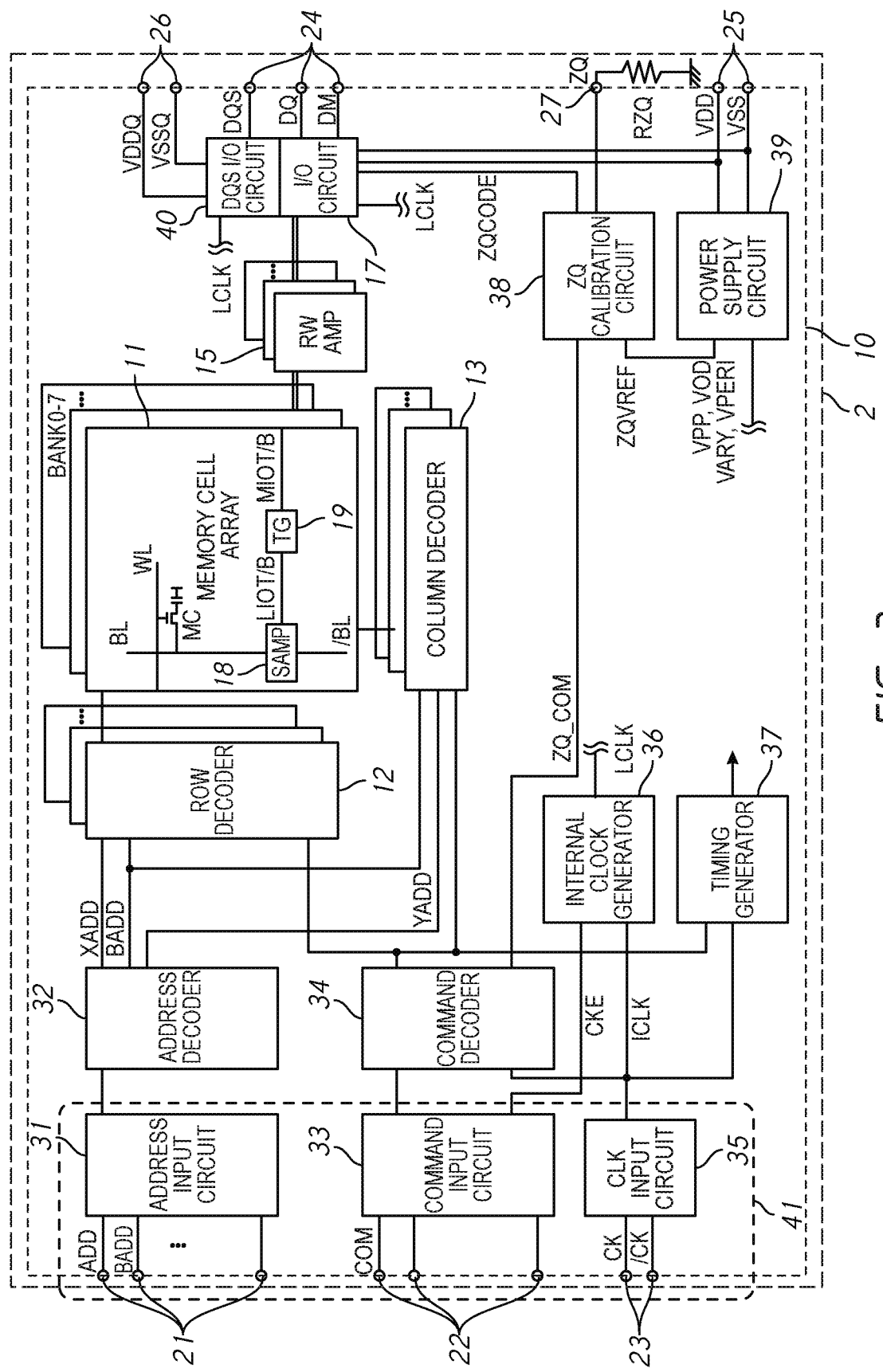
FIG. 3 is a block diagram of a memory die in accordance with the present disclosure.

FIG. 3 is a block diagram of a memory die, generally designated 310 in accordance with an embodiment of the present disclosure. The memory die 310 may be implemented, for example, as the memory dice 110(1)-(N) of FIG. 1. The memory die 310 may be a DDR4 SDRAM integrated into a single semiconductor chip, for example. The memory die 310 may be mounted on an external substrate 2 that is a memory module substrate, a mother board or the like. The external substrate 2 may employ an external resistor $R_{ZQ}$ that is connected to a calibration terminal ZQ 27 of the memory die 310. The external resistor $R_{ZQ}$ is a reference impedance of a ZQ calibration circuit 38. In the present embodiment, the external resistor $R_{ZQ}$ is coupled to a ground potential.

As shown in FIG. 3, the memory die 310 includes a memory cell array 11. The memory cell array 11 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 12 and the selection of the bit line BL is performed by a column decoder 13. Sense amplifiers 18 are coupled to corresponding bit lines BL and connected to local I/O line pairs LIOT/B. Local IO line pairs LIOT/B are connected to main 10 line pairs MIOT/B via transfer gates TG 19 which function as switches.

Turning to the explanation of a plurality of external terminals included in the memory die 310, the plurality of external terminals includes address terminals 21, command terminals 22, clock terminals 23, data terminals 24, power supply terminals 25 and 26, and the calibration terminal ZQ 27. An input signal block 41 may include the address terminals 21, the command terminals 22 and the clock terminals 23. The data terminals 24 may be coupled to output buffers for read operations of memories. The output buffer may be located on a separate logic die, such as logic die 202 of FIG. 2. FIG. 3 shows an example of dynamic random access memory (DRAM), however, any device having external terminals for signal input/output may be included as the external terminals of embodiments of the present disclosure.

The address terminals 21 are supplied with an address signal ADD and a bank address signal BADD. The address signal ADD and the bank address signal BADD supplied to the address terminals 21 are transferred via an address input circuit 31 to an address decoder 32. The address decoder 32 receives the address signal ADD and supplies a decoded row address signal XADD to the row decoder 12, and a decoded column address signal YADD to the column decoder 13. The address decoder 32 also receives the bank address signal BADD and supplies the bank address signal BADD to the row decoder 12 and the column decoder 13.

The command terminals 22 are supplied with a command signal COM. The command signal COM may include one or more separate signals. The command signal COM input to the command terminals 21 is input to a command decoder 34 via the command input circuit 33. The command decoder 34 decodes the command signal COM to generate various internal command signals. For example, the internal commands may include a row command signal to select a word line and a column command signal, such as a read command or a write command, to select a bit line, and a calibration signal ZQC provided to the ZQ calibration circuit 38.

Accordingly, when a read command is issued and a row address and a column address are timely supplied with the read command, read data is read from a memory cell MC in the memory cell array 11 designated by these row address and column address. The read data DO is output externally from the data terminals 24 via a read/write amplifier 15 and an input/output circuit 17. A differential data strobe signal DQS may be provided by a DQS input/output circuit 40. Similarly, when the write command is issued and a row address and a column address are timely supplied with the write command, and then write data DO is supplied to the data terminals 24, the write data DO is supplied via the input/output circuit 17 and the read/write amplifier 15 to the memory cell array 11 and written in the memory cell MC designated by the row address and the column address.

The clock terminals 23 are supplied with external clock signals CK and /CK, respectively. These external clock signals CK and /CK are complementary to each other and are supplied to a clock input circuit 35. The clock input circuit 35 receives the external clock signals CK and /CK and generates an internal clock signal ICLK. The internal clock signal ICLK is supplied to an internal clock generator 36 and thus a phase controlled internal clock signal LCLK is generated based on the received internal clock signal ICLK and a clock enable signal CKE from the command input circuit 33. Although not limited thereto, a DLL circuit can be used as the internal clock generator 36. The phase controlled internal clock signal LCLK is supplied to the input/output circuit 17 and the DQS input/output circuit 40 and is used as a timing signal for determining an output timing of the read data DO and differential strobe signal DQS. The internal clock signal ICLK is also supplied to a timing generator 37 and thus various internal clock signals can be generated.

The power supply terminals 25 are supplied with power supply potentials VDD and VSS. These power supply potentials VDD and VSS are supplied to an internal power supply circuit 39. The internal power supply circuit 39 generates various internal potentials VPP, VOD, VARY, VPERI, and the like and a reference potential ZQVREF based on the power supply potentials VDD and VSS. The internal potential VPP is mainly used in the row decoder 12, the internal potentials VOD and VARY are mainly used in the sense amplifiers 18 included in the memory cell array 11, and the internal potential VPERI is used in many other circuit blocks. The reference potential ZQVREF is used in the ZQ calibration circuit 38.

The power supply terminals 26 are supplied with power supply potentials VDDQ and VSSQ. These power supply potentials VDDQ and VSSQ are supplied to the input/output circuit 17 and the DQS input/output circuit 40. The power supply potentials VDDQ and VSSQ may be the same potentials as the power supply potentials VDD and VSS that are supplied to the power supply terminals 25, respectively. However, the dedicated power supply potentials VDDQ and VSSQ may be used for the input/output circuit 17 and the DQS input/output circuit 40 so that power supply noise generated by the input/output circuit 17 does not propagate to the other circuit blocks.

The calibration terminal ZQ is connected to the calibration circuit 38. The calibration circuit 38 performs a calibration operation with reference to an impedance of an external resistance Re and the reference potential ZQVREF, when activated by the calibration signal ZQ_COM. An impedance code ZQCODE obtained by the calibration operation is supplied to the input/output circuit 17 and the DQS input/output circuit 40, and thus an impedance of output buffers (not shown) included in the input/output circuit 17 and the DQS input/output circuit 40 is specified.

Figure 4:
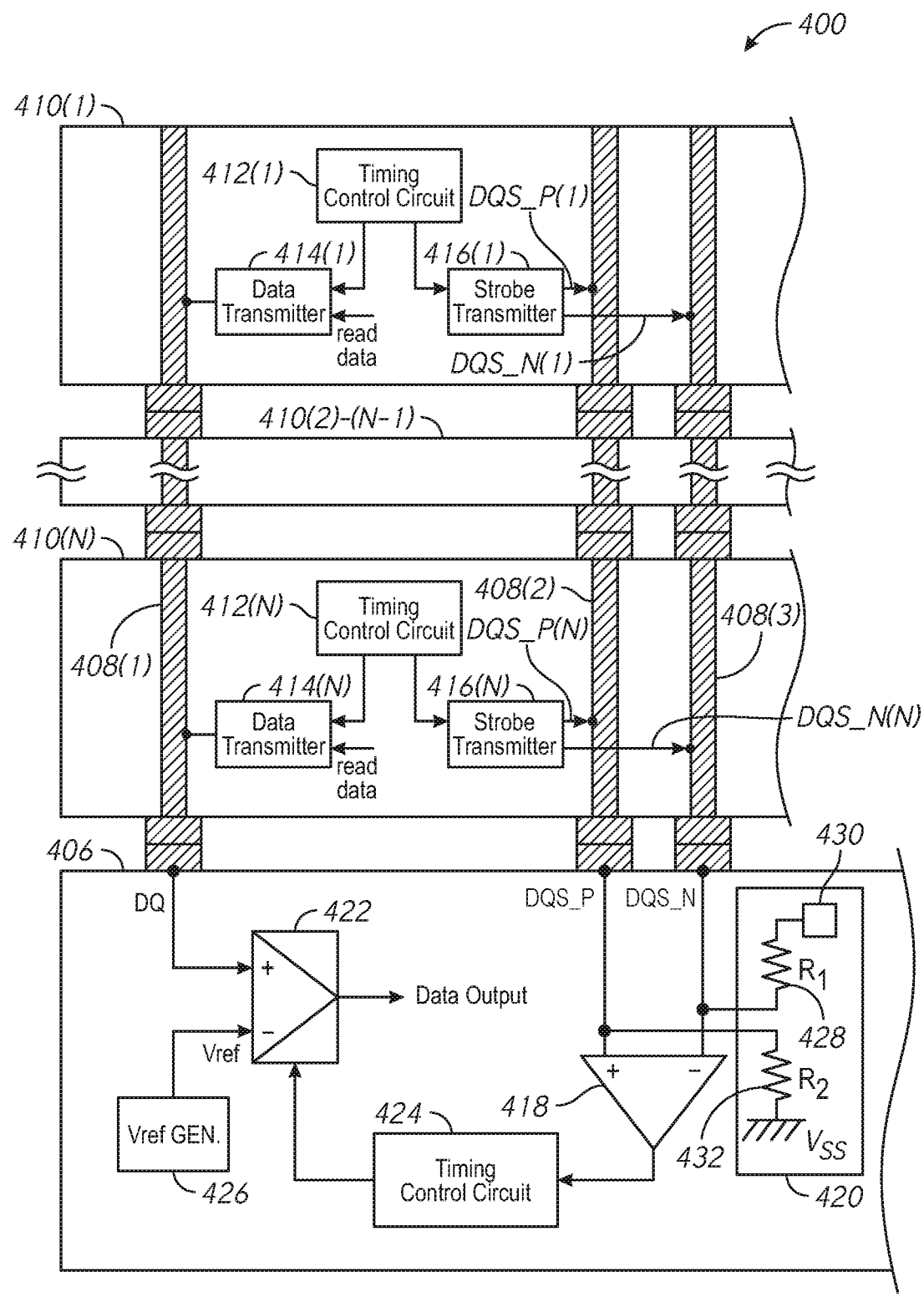
FIG. 4 is a block diagram of a memory system, in accordance with an embodiment of the present invention.

FIG. 4 is a block diagram of a memory system, generally designated 400, in accordance with an embodiment of the present invention. The memory system 400 may be implemented as the memory system 100 of FIG. 1. The memory system 400 includes a logic die 406 and a plurality of stacked memory dice 410(1)-(N). The logic die 406 may be implemented as one or more of the vault logic circuits 106 of FIG. 1. The memory dice 410(1)-(N) may be implemented as the memory dice 110(1)-(N) of FIG. 1 and/or the memory die 310 of FIG. 3. The logic die 406 may be coupled to the memory dice 410(1)-(N) by a plurality of TSVs 408(1)-(3) extending through the logic die 406 and the memory dice 410(1)-(N). The TSVs 408(1)-(3) may be made of any suitable electrically conducting material, such as copper. Each memory die 410 includes a timing control circuit 412, a data transmitter 414, and a strobe differential transmitter 416. The timing control circuit 412 may be included in the internal clock generator 36 of FIG. 3. The data transmitter 414 and the strobe differential transmitter 416 may be included in the input output circuit 17 and the DQS input/output circuit 40 of FIG. 3, respectively. The memory die 410(1) includes a timing control circuit 412(1), a data transmitter 414(1), and a strobe differential transmitter 416(1) and the memory die 410(N) includes a timing control circuit 412(N), a data transmitter 414(N), and a strobe differential transmitter 416(N). The logic die 406 includes a strobe receiver circuit 418, a termination circuit 420, a timing control circuit 424, a data receiver circuit 422, and a reference voltage generator 426. The termination circuit 420 includes a first termination resistance 428 coupled between the TSV 408(3) and a pull-up voltage generator 430, and a second termination resistance 432 coupled between the TSV 408(2) and a voltage $V_{SS}$. The termination resistances may generally be any type of resistance elements, such as resistors.

The data transmitter 414(1) includes circuit components configured to provide data read from a memory array (not shown), such as the memory array 11 of FIG. 3. The data transmitter 414(1) may be, for example, an amplifier, such as a continuous time amplifier. The data transmitter 414(1) may be coupled to the timing control circuit 412(1) and the TSV 408(1). The strobe differential transmitter 416(1) includes circuit components configured to provide a differential strobe signal that can be used to synchronize data output at the logic die 406. The strobe differential transmitter may be, for example, a tristate transmitter that provides a differential strobe signal. The strobe differential transmitter 416(1) is coupled to the timing control circuit 412(1) and to the TSVs 408(2) and 408(3). The TSVs 408(2) and 408(3) together form a differential signaling bus configured to carry the differential strobe signal provided by the strobe differential transmitter 416(1). For example, the strobe differential transmitter 416(1) may be configured to provide a first strobe signal DQS_P(1) to the TSV 408(2) and a second, complementary strobe signal DQS_N(1) to the TSV 408(3). Similarly, the strobe differential transmitter 416(N) may be configured to provide a first strobe signal DQS_P(N) to the TSV 408(2) and a second, complementary strobe signal DQS_N(N) to the TSV 408(3). The timing control circuit 412(1) includes circuit components configured to provide timing control signals to the data transmitter 414(1) and the strobe differential transmitter 416(1) to synchronize the outputs of the data transmitter 414(1) and the strobe differential transmitter 416(1).

In operation, data requested by a read command may be retrieved from the memory cells of the memory array and provided to the data transmitter 414(1), which amplifies the read data and provides the amplified read data to the logic die 406 via the TSV 408(1). The data transmitter 414(1) provides the read data in accordance with timing control signals received from the timing control circuit 412(1). At substantially the same time, the strobe differential transmitter 416(1) provides differential strobe signals to the TSVs 408(1) and 408(2) in accordance with the timing control signals received from the timing control circuit 412(1). For example, the strobe differential transmitter 416(1) may provide a first strobe signal, such as a periodic signal, via the TSV 408(2). The strobe differential transmitter 416(1) may provide a second strobe signal that is complementary to the first strobe signal on the TSV 408(3). While the foregoing description has been provided with respect to the memory die 410(1), the description is generally applicable to any of the memory die 410(1)-(N).

The data receiver 422 includes circuit components configured to receive data signals provided by a data transmitter 414 and to provide an output signal on a data bus DQ. The data receiver 422 may be, for example, an amplifier. The data receiver may have a first input terminal coupled to the TSV 408(1) and a second input terminal coupled to the reference voltage generator 426. The reference voltage generator 426 may be any type of voltage source and is configured to provide a reference voltage $V_{ref}$.

The strobe receiver circuit 418 may be a differential receiver that receives the differential strobe signal via the TSVs 408(2) and 408(3). For example, the strobe receiver circuit may be a continuous time differential amplifier. Based on the received differential strobe signal, the strobe receiver circuit 418 provides an output signal to the timing control circuit 424. For example, the strobe receiver circuit 418 may provide an active output signal (e.g., logic high) responsive to the first strobe signal (e.g., DQS_P) received on the TSV 408(2) transitioning from inactive (e.g., logic low) to active (e.g., logic high). The strobe receiver circuit 418 may provide an inactive output signal (e.g., logic low) responsive to the second strobe signal (e.g., strobe signal DQS_N) transitioning from inactive (e.g., logic low) to active (e.g., logic high).

The timing control circuit 424 may receive the output of the differential receiver circuit 418 and provide data strobe signals to the data receiver circuit. The timing control circuit may adjust (e.g., delay) the output signals received from the strobe receiver circuit 418 to synchronize the data strobe signals with the data signals received by the data receiver 422. Synchronizing the data strobe signals with the data signals may comprise, for example, edge-aligning the data strobe signals with the center of the center (or position to increase data integrity). The timing control circuit 424 may provide the adjusted data strobe signals to the data receiver 422 to verify the data provided by the data receiver 422.

When none of the strobe differential transmitters 416(1)-(N) have data to transmit, all of the strobe differential transmitters 416(1)-(N) may be in high impedance states. Because none of the strobe differential transmitters 416(1)-(N) are driving a signal on the TSVs 408(2) and 408(3), the termination circuit 420 tends to pull the TSVs 408(2) and 408(3) to particular values. Many traditional termination circuits couple both TSVs 408(2) and 408(3) to termination resistances and to ground. As a result, both TSVs 408(2) and 408(3) are pulled to ground and the differential signal on the TSVs 408(2) and 408(3) is lost. This loss of differential signal may have adverse effects when one of the strobe differential transmitters 416(1)-(N) attempts to transmit a new differential signal via the TSVs 408(2) and 408(3). For example, noise may result in the output of the strobe receiver 318 toggling between states or the leading edge of the data received by the data receiver 422 may be missed as the differential signal is reestablished on the TSVs 408(2) and 408(3).

To avoid these adverse effects, the termination circuit 420 pulls the TSVs 408(2) and 408(3) to different differential values, thus preserving the differential signal on the TSVs 408(2) and 408(3). As shown in FIG. 4, the TSV 408(3) is coupled to a first termination resistance 428 having a first resistance, $R_1$. The first termination resistance 428 is coupled to a pull-up voltage generator 430, which is configured to provide a predetermined voltage having a first differential value. The pull-up generator 430 may be, for example, a voltage digital-to-analog converter (DAC). The voltage DAC may be programmable to provide a programmed current to the first termination resistance 428, generating a voltage across the first termination resistance 428. The TSV 408(2) is coupled to a second termination resistance 432 having a second resistance, $R_2$. The second termination resistance 432 is coupled to a second voltage $V_{SS}$, which may be, for example, ground. In other embodiments, the second voltage $V_{SS}$ may be a pull-down voltage generator configured to provide a voltage having a second differential value that is different than the predetermined voltage provided by the pull-up voltage generator 430. In various embodiments, the predetermined voltage provided by the pull-up voltage generator 430 is substantially the same as a logical high voltage provided by the strobe differential transmitters 416(1)-(N) and the second voltage $V_{SS}$ is substantially the same as the logical low signal provided by the strobe differential transmitters 416(1)-(N). Although TSV 408(2) is shown as being coupled to the first termination resistance 428 and the TSV 408(3) is shown as being coupled to the second termination resistance 432, those skilled in the art will appreciate that these connections may be reversed such that TSV 408(2) may be coupled to the second termination resistance 432 and the TSV 408(3) is coupled to the first termination resistance 428. In operation, when all of the strobe differential transmitters 416 are in the high impedance state, the TSV 408(2) is pulled to the second voltage $V_{SS}$ (e.g., ground) through the second termination resistance 432. Similarly, the TSV 408(3) is pulled to the predetermine voltage provided by the pull-up voltage generator 430 through the first termination resistance 428. As a result, the differential signal is maintained on the TSVs 408(1) and 408(2) even when no strobe differential transmitters 416 are transmitting.

Figure 5:
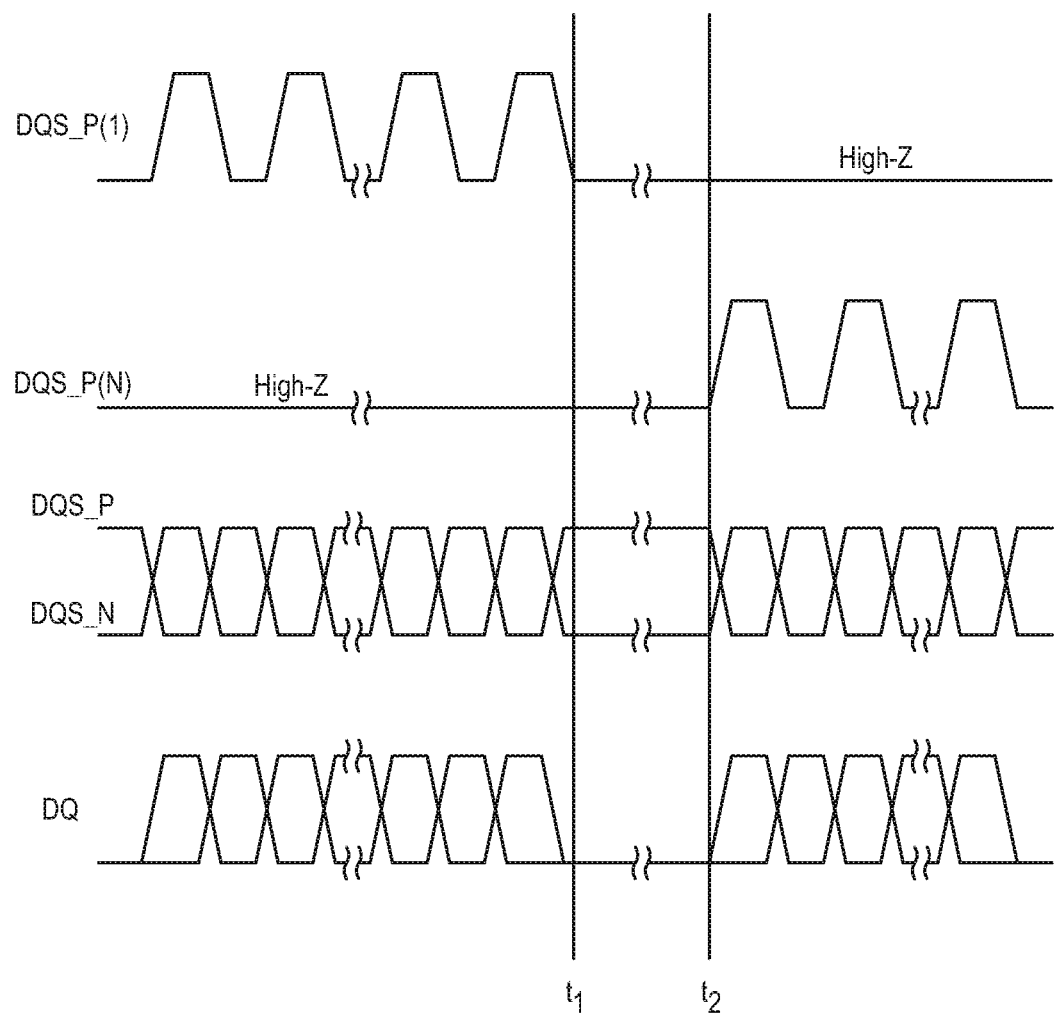
FIG. 5 is a timing diagram for a differential transmission circuit with a termination circuit, in accordance with an embodiment of the present invention.

FIG. 5 is a timing diagram for a differential transmission circuit with a termination circuit, in accordance with an embodiment of the present invention. The strobe signal DQS_P(1) is an example positive output signal of the strobe differential transmitter 416(1) of FIG. 4. The strobe signal DQS_P(N) is an example positive output signal of the strobe differential transmitter 416(N) of FIG. 4. For the sake of clarity, the complementary negative output signals of the strobe differential transmitters 416(1) and 416(N) are not shown. The strobe signals DQS_P and DQS_N are example differential strobe signals received by the strobe receiver 418 of FIG. 4. The DQ signal is an example data signal received by the data receiver 422 of FIG. 4.

As shown in FIG. 5, the strobe differential transmitter 416(1) provides a first positive strobe signal DQS_P(1) (e.g. on TSV 408(2) until time $t_1$. The strobe differential transmitter 416(N) is in a high impedance state (shown as strobe signal DQS_P(N) labeled "High-Z") while the strobe transmitter 416(1) transmits. Prior to time $t_1$, the strobe receiver 418 receives the strobe signal DQS_P, which matches the strobe signal DQS_P(1) provided by the strobe differential transmitter, and the strobe signal DQS_N, which is complementary to the strobe signal DQS_P. The DQ signal is provided by the data transmitter 414(1) and received by the data receiver 422.

At time $t_1$, the strobe differential transmitter 416(1) enters the high impedance state (shown as strobe signal DQS_P(1) labelled "High Z"). Between times $t_1$ and $t_2$, both the strobe differential transmitter 416(1) and the strobe differential transmitter 416(N) are in the high impedance state (shown as both strobe signals DQS_P(1) and DQS_P(N) labelled "High-Z" in FIG. 5). During this period, the TSVs are pulled to either the predetermined voltage provided by the pull-up voltage generator 430 or to the voltage $V_{SS}$ based on which voltage each TSV is coupled to. In the embodiment of FIG. 5, the strobe signal DQS_P is pulled to a logical high state (e.g., the predetermined voltage provided by the pull-up voltage generator 430) and the strobe signal DQS_N is pulled to a logical low state (e.g., the voltage $V_{SS}$ or ground). Additionally, between times $t_1$ and $t_2$, the data transmitter is not transmitting any data on the TSV(1) as shown by the signal DQ having a logical low value. In some embodiments, the data transmitters 414 may also enter a high impedance state when they do not have data to transmit, meaning the DQ signal would be at high impedance between times $t_1$ and $t_2$, as opposed to logical low.

At time $t_2$, the strobe differential transmitter 416(N) exits the high impedance state and begins transmitting differential strobe signals as shown in FIG. 5 by the strobe signal DQS_P(N). The strobe signal DQS_P and its complementary strobe signal DQS_N are received by the strobe receiver 418. The strobe signal DQS_P corresponds to the strobe signal DQS_P(N) provided by the strobe differential transmitter 416(N). At time $t_2$, the data transmitter 414(N) provides data as the DQ signal, which is received by the data receiver 422.

Figure 6:
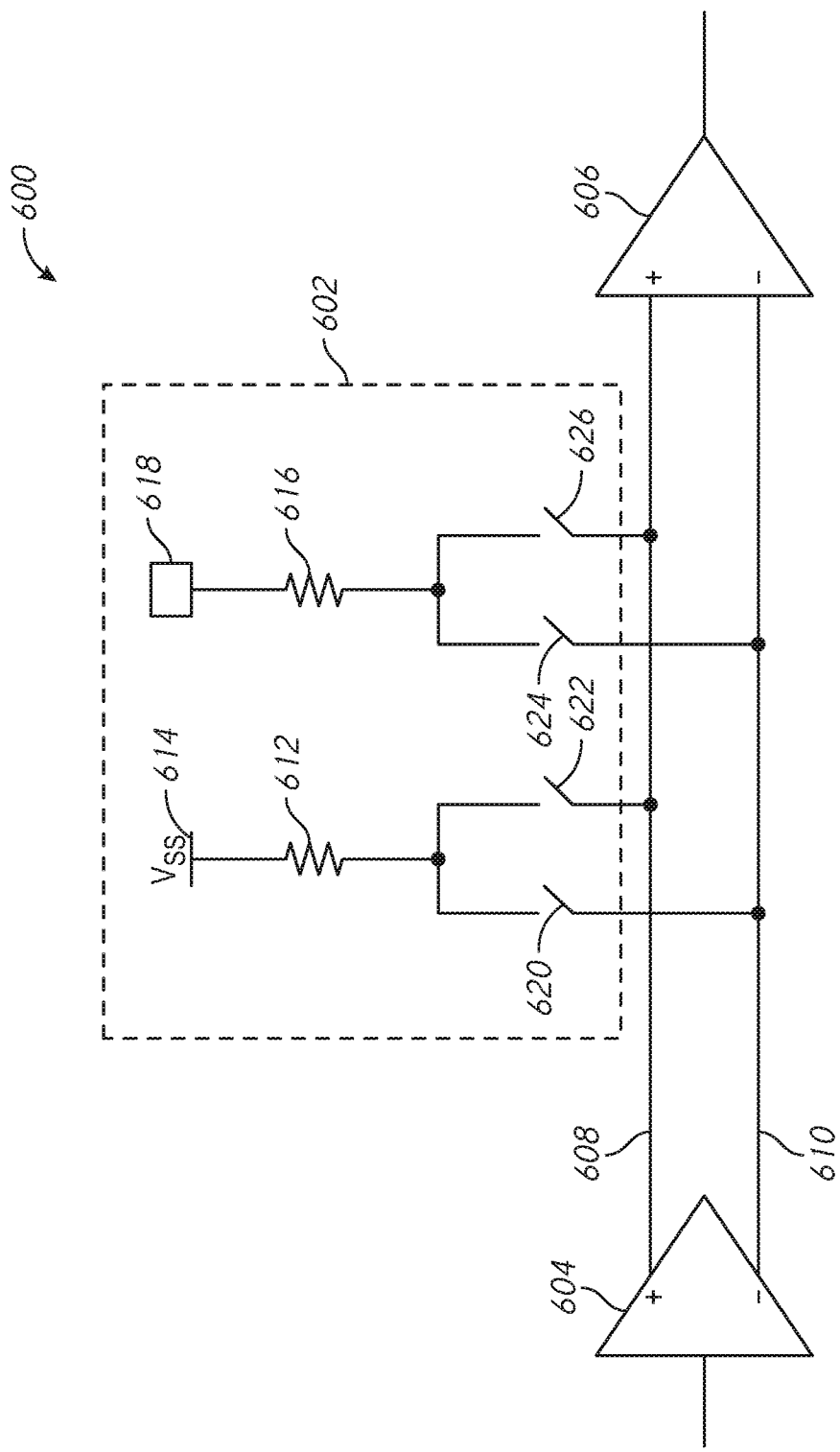
FIG. 6 is a circuit diagram of a differential transmission circuit having a termination circuit according to an embodiment of the present invention.

FIG. 6 is a circuit diagram of a differential transmission circuit, generally designated 600, having a termination circuit 602 according to an embodiment of the present invention. The differential transmission circuit includes a termination circuit 602, a differential transmitter 604, a receiver circuit 606, and differential signal lines 608 and 610. The differential transmitter 604 may be implemented as one or more of the strobe differential transmitters 416(1)-(N) of FIG. 4. For example, the differential transmitter 604 may be configured to provide a differential signal on the differential signal lines 608 and 610 and to enter a high impedance state when the differential transmitter does not have a signal to transmit. The receiver circuit 606 may be implemented as the receiver circuit 418 of FIG. 4. The differential signal lines 608 and 610 may be implemented as the TSVs 408(2) and 408(3) of FIG. 4.

The termination circuit 602 includes a first termination resistance 612, a first voltage 614, a second termination resistance 616, a pull-up voltage generator 618 and switches 620-626. The first termination resistance 612 and the second termination resistance 616 may be implemented as the termination resistances 432 and 428 of FIG. 4, respectively. The first voltage 612 may be implemented as the voltage $V_{SS}$ in FIG. 4. The pull-up voltage generator 618 may be implemented as the pull-up generator 430 of FIG. 4. For example, the pull-up generator 618 may be implemented as a voltage DAC. The switches 620-626 may be any suitable type of switch, such as a transistor. The switch 620 may be coupled between the differential signal line 610 and the termination resistance 612, which is coupled to the first voltage $V_{SS}$. The switch 622 may be coupled between the differential signal line 608 and the termination resistance 612. The switch 624 may be coupled between the differential signal line 610 and the termination resistance 616, which is coupled to the pull-up voltage generator 618. The switch 626 may be coupled between the differential signal line 608 and the termination resistance 616.

By selectively activating/deactivating the switches 620-626, the differential signal lines 608 and 610 may be selectively coupled to either the first voltage $V_{SS}$ or the pull-up voltage generator 618. In some embodiments, the switches 620-626 may be activated/deactivated to preserve the state of the last differential signal provided by the differential transmitter 604 before entering the high impedance state. For example, if the last differential signal provided by the differential transmitter 604 is logical high on the signal line 608 and logical low on the signal line 610, then the switches 620 and 626 may be activated, and the switches 622 and 624 may be deactivated. The switch 620 couples the signal line 610 to the second voltage $V_{SS}$, which may be substantially the same as the logical low value provided by the differential transmitter 604. The switch 626 couples the signal line 608 to the pull-up voltage generator 618, which may provide a voltage that is substantially the same as logical high value provided by the differential transmitter 604. Alternatively, if the last differential signal provided by the differential transmitter 604 is logical high on the signal line 610 and logical low on the signal line 608, then the switches 622 and 624 may be activated, and the switches 620 and 626 may be deactivated. The switch 622 couples the signal line 608 to the second voltage $V_{SS}$, which may be substantially the same as the logical low value provided by the differential transmitter 604. The switch 624 couples the signal line 610 to the pull-up voltage generator 618, which may provide a voltage that is substantially the same as logical high value provided by the differential transmitter 604. The switches may be selectively activated based on, for example, feedforward information received from the differential transmitter 604 or feedback information from the receiver circuit 606.

Figure 7:
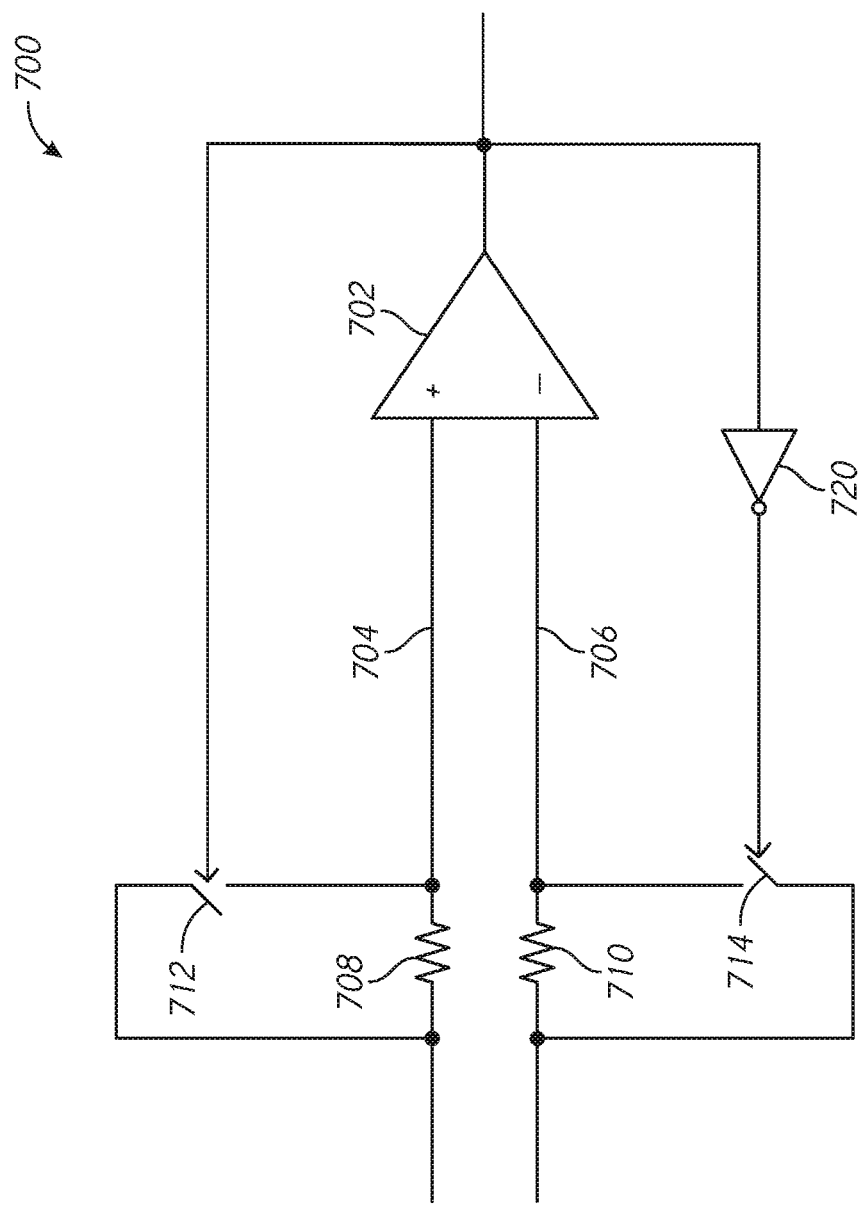
FIG. 7 is a circuit diagram of a receiver circuit with hysteresis at the receiver input, in accordance with an embodiment of the present invention.
Figure 8:
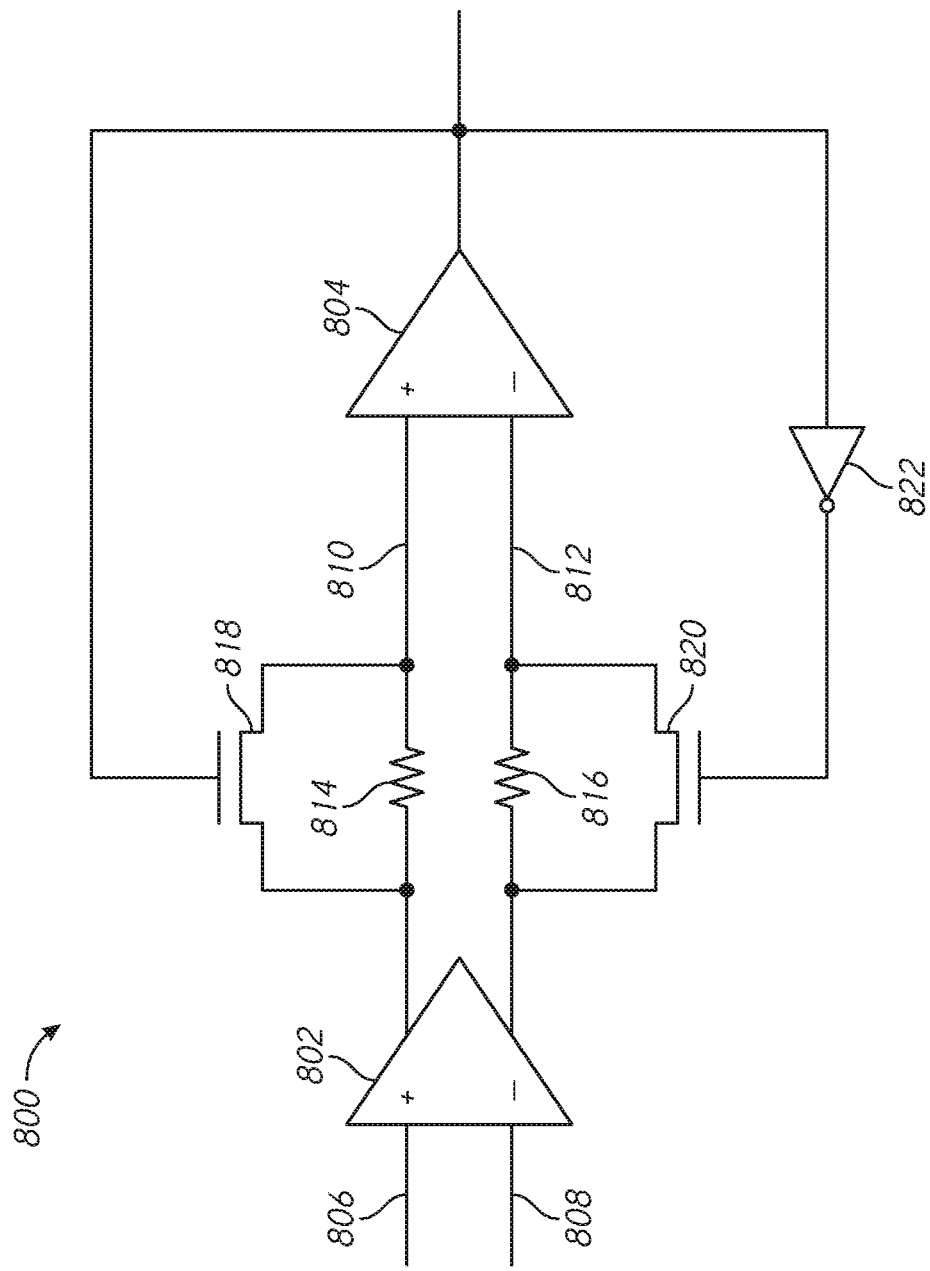
FIG. 8 is a circuit diagram of a receiver circuit with internal hysteresis, in accordance with an embodiment of the present invention.

FIGS. 7 and 8 illustrate embodiments of the present invention that employ hysteresis at the receiver to preserve the differential signals. Hysteresis may provide an alternative to a termination circuit for maintaining a differential signal on a differential signal bus when transmitters coupled to the differential signal bus are all in a high impedance state. FIG. 7 is a circuit diagram of a receiver circuit, generally designated 700, with hysteresis at the receiver input, in accordance with an embodiment of the present invention. The receiver 700 includes a receiver circuit 702 coupled to signal lines 704 and 706, termination resistances 708 and 710, switches 712 and 714, and an inverter 720. The receiver circuit 702 may be configured to receive a differential signal on the signal lines 704 and 706, and to provide an output signal based on the voltage difference between the signal lines 704 and 706. The termination resistance 708 may be coupled to the signal line 704 and the termination resistance 710 may be coupled to the signal line 706. The switch 712 may be coupled to the signal line 704 in parallel with the termination resistance 708. The switch 714 may be coupled to the signal line 706 in parallel with the termination resistance 710. The inverter 720 may be any suitable type of inverting circuit and may be configured to switch a signal from one logical value to another (e.g., switch a logic high signal to a logic low signal. The inverter 720 may be coupled between the output of the receiver circuit 702 and the switch 714.

In operation, the output of the receiver circuit 702 generates a feedback loop to selectively short out one of the termination resistances 708 or 710, creating a voltage difference between the signal lines 704 and 706. For example, if the receiver circuit 702 outputs a logical high voltage, the output of the receiver circuit 702 may activate the switch 712. As a result, current is allowed to flow through the switch 712, shorting the signal line 704 around the termination resistance 708. The inverter 720 may flip the logical high signal to a logical low signal, thereby deactivating the switch 714 (e.g., open), forcing any signal on the signal line 706 through the termination resistance 710. Because the termination resistance 708 is shorted from the signal line 704 and the termination resistance 710 remains in the path of the signal line 706, a voltage differential is created between the signal lines 704 and 706, thereby preserving the differential signal on the signal lines 704 and 706. Those skilled in the art will appreciate that the hysteresis shown in FIG. 7 occurs at the input to the receiver circuit 702.

Alternatively, if the receiver circuit 702 outputs a logical low voltage, the inverter 720 may provide a signal to activate the switch 714. As a result, current is allowed to flow through the switch 714, shorting the signal line 706 around the termination resistance 710. The inverter 720 may flip the logical low signal to a logical high signal, thereby activating the switch 714. Because the receiver circuit 702 provides a logical low voltage, the switch 712 remains deactivated (e.g., open), forcing any signal on the signal line 704 through the termination resistance 708. Because the termination resistance 710 is shorted from the signal line 706 and the termination resistance 708 remains in the path of the signal line 704, a voltage differential is created between the signal lines 704 and 706, thereby preserving the differential signal on the signal lines 704 and 706.

FIG. 8 is a circuit diagram of a receiver circuit, generally designated 800, with internal hysteresis, in accordance with an embodiment of the present invention. Unlike the receiver circuit 700 in FIG. 7, the receiver circuit 800 in FIG. 8 implements hysteresis internal to the receiver circuit, as opposed to at the input of the receiver circuit, as in FIG. 7. The receiver circuit 800 includes a pre-gain stage 802 and a main stage 804. The pre-gain stage receives a differential signal on signal lines 806 and 808, and provides an intermediate output on signal lines 810 and 812. The main stage receives the intermediate output on the signal lines 810 and 812 and provides a final output signal.

The receiver circuit 800 further includes termination resistances 814 and 816, bypass transistors 818 and 820, and an inverter 822. The termination resistances 814 and 816 are coupled in series with the signal lines 810 and 812, respectively, between the pre-gain stage 802 and the main stage 804. The bypass transistors 818 and 820 are coupled to the signal lines 810 and 812 in parallel to the termination resistances 814 and 816, respectively. The output of the main stage 804 is coupled to the gate of the bypass transistor 818 and to the input of the inverter 822. The output of the inverter 822 is coupled to the gate of the bypass transistor 820.

The principle of operation of the receiver circuit 800 is generally similar to that of the receiver circuit 700 of FIG. 7. Specifically, the termination resistances 814 or 816 can be selectively shorted from the circuit based on the output of the receiver to generate a voltage difference across signal lines to maintain a differential signal. For example, if the main stage 804 provides a logic high output signal, the bypass transistor 818 is activated, allowing current to flow through the transistor and bypass the termination resistance 814. The inverter 822 converts the logic high signal to a logic low signal, which prevents the bypass transistor 820 from conducting. Therefore, the output of the pre-gain stage on the signal line 812 passes through the termination resistance 816, creating a voltage difference across the termination resistance 816 and maintaining a differential signal across the signal lines 810 and 812.

Those of ordinary skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Skilled artisans may implement the described functionality in varying ways for each particular application, but such implementation decisions should not be interpreted as causing a departure from the scope of the present disclosure.

What is claimed is:

1. An apparatus comprising:
   a differential signaling bus;
   a first voltage source;
   a second voltage source, wherein the first and second voltage sources have different voltage levels;
   a memory die comprising a memory array and a tristate transmitter coupled to the differential signaling bus; and
   a logic die comprising:
      a receiver coupled to the differential signaling bus at an input of the receiver, the input comprising a pair of differential inputs; and
      a termination circuit configured to couple a first differential input of the pair of differential inputs to the first voltage source and to couple a second differential input of the pair of differential inputs to the second voltage source.

2. The apparatus of claim 1, wherein the termination circuit comprises a first termination resistor coupled between the first voltage source and a selected one of the first and second differential inputs.

3. The apparatus of claim 1, wherein the first voltage source comprises a pull-up voltage generator.

4. The apparatus of claim 3, wherein the pull-up voltage generator comprises a programmable voltage digital-to-analog converter.

5. The apparatus of claim 1, wherein the second voltage source comprises a pull-down voltage generator.

6. The apparatus of claim 1, wherein a voltage level of the first voltage source is the same as a first differential value of the differential signal.

7. The apparatus of claim 6, wherein a voltage level of the second voltage source is the same as a second differential value of the differential signal.

8. The apparatus of claim 1, wherein the transmitter comprises a tristate buffer and the receiver comprises a differential amplifier.

9. The apparatus of claim 1, wherein the receiver includes a continuous time differential amplifier.

10. An apparatus comprising:
   a signaling bus;
   a plurality of memory dice, each of the plurality of memory dice comprising:
      a memory cell array; and
      a tristate transmitter connected with the signaling bus, the tristate transmitter configured to provide a data signal on the signaling bus responsive to a corresponding control signal; and
   a logic die comprising:
      a receiver connected with the signaling bus, the receiver configured to receive the data signal from the signaling bus; and
      a circuit configured to provide a predetermined input voltage for the receiver such that the receiver can determine whether the predetermined input voltage is data "0" or "1" when all the tristate transmitters connected with the signaling bus are switched to high-Z responsive to the corresponding control signal.

11. The apparatus of claim 10, wherein signaling bus is a differential signaling bus.

12. The apparatus of claim 11, wherein the differential signaling bus comprises a pair of through silicon vias extending through the plurality of memory dice and the logic die.

13. The apparatus of claim 12, wherein the circuit comprises a first voltage source configured to provide the predetermined voltage to a first through silicon via of the pair of through silicon vias.

14. The apparatus of claim 13, wherein the circuit further comprises a first termination resistor coupled between the first voltage source and the first through silicon via of the pair of through silicon vias.

15. The apparatus of claim 14, wherein the circuit further comprises a switch coupled between the termination resistor and the first through silicon via of the pair of through silicon vias, wherein the switch may be activated by the control signal.

16. The apparatus of claim 12, wherein the circuit comprises:
   a first voltage source;
   a first switch coupled between the first voltage source and a first through silicon via of the pair of through silicon vias; and
   a second switch coupled between the first voltage source and a second through silicon via of the pair of through silicon vias, wherein the first switch and the second switch are configured to selectively couple the first voltage source to either the first or second through silicon via to provide the predetermined voltage responsive, at least in part, to the control signal.

17. The apparatus of claim 16, wherein the circuit further comprises:
   a second voltage source;
   a third switch coupled between the second voltage source and the first through silicon via of the pair of through silicon vias; and
   a fourth switch coupled between the second voltage source and the second through silicon via of the pair of through silicon vias,
   wherein the first switch and the second switch are configured to selectively couple the first voltage source to either the first or second through silicon via and wherein the third switch and the fourth switch are configured to selectively couple the second voltage source to either the first or second through silicon via to provide the predetermined voltage responsive, at least in part, to the control signal.

18. The apparatus of claim 17, wherein the first voltage source and the second voltage source are coupled to different ones of the pair of through silicon vias.

19. A method comprising:
   transmitting, with a tri state transmitter of a memory die comprising a memory array, a data signal on a signaling bus to a receiver;
   transitioning the tristate transmitter to a high impedance state; and
   providing, with a termination circuit of a logic die coupled to the memory die, a predetermined input voltage for the receiver by coupling an input of the receiver to at least one of a first voltage source or a second voltage source having a different voltage level than the first voltage source such that the receiver can determine whether the predetermined input voltage is logic "0" or "1", responsive to completion of transmitting the data signal and transitioning the tristate transmitter to the high impedance state.

20. The method of claim 19, wherein the signaling bus is a differential signaling bus.

21. The method of claim 20, wherein providing the predetermined input voltage comprises coupling a first signal line of the signaling bus to the first voltage source and a second signal line of the signaling bus to the second voltage source.

22. The method of claim 19, wherein the predetermined input voltage is the same logic state as a last logic level of the data signal.

23. The method of claim 19, further comprising:
   transitioning the tristate transmitter to a data transmission state; and
   transmitting a second data signal on the signaling bus to the receiver.

* * * * *